(12) United States Patent
Frahm et al.

(10) Patent No.: US 8,384,383 B2
(45) Date of Patent: Feb. 26, 2013

(54) METHOD AND DEVICE FOR RECONSTRUCTING A SEQUENCE OF MAGNETIC RESONANCE IMAGES

(75) Inventors: Jens Frahm, Goettingen (DE); Martin Uecker, Goettingen (DE); Shuo Zhang, Goettingen (DE)

(73) Assignee: Max-Planck-Gesellschaft zur Foerferung der Wissenschaften E.V., Munich (DE)

( * ) Notice: Subject to any disclaimer, the term of this patent is extended or adjusted under 35 U.S.C. 154(b) by 472 days.

(21) Appl. No.: 12/730,178

(22) Filed: Mar. 23, 2010

(65) Prior Publication Data

US 2011/0234222 A1 Sep. 29, 2011

(51) Int. Cl.
*G01R 33/48* (2006.01)
*G01V 3/00* (2006.01)

(52) U.S. Cl. ........ 324/309; 324/307; 324/318; 600/410; 702/189

(58) Field of Classification Search .......... 324/300–322; 600/407–464; 382/128–131
See application file for complete search history.

(56) References Cited

U.S. PATENT DOCUMENTS

| | | | |
|---|---|---|---|
| 4,707,658 A | 11/1987 | Frahm et al. | |
| 6,556,009 B2 * | 4/2003 | Kellman et al. | 324/309 |
| 6,614,225 B1 * | 9/2003 | Feinberg | 324/307 |
| 2004/0155652 A1 * | 8/2004 | Sodickson | 324/307 |
| 2004/0227512 A1 * | 11/2004 | Twieg | 324/309 |

(Continued)

FOREIGN PATENT DOCUMENTS

DE 3504734 A1 8/1986

OTHER PUBLICATIONS

Ahn et al., "High-Speed Spiral-Scan Echo Planar NMR Imaging—I", IEEE Transactions on Medical Imaging, vol. MI-5, No. 1, pp. 2-7 (1986).

(Continued)

*Primary Examiner* — Vincent Q Nguyen
*Assistant Examiner* — Emily Chan
(74) *Attorney, Agent, or Firm* — Caesar, Rivise, Bernstein, Cohen & Pokotilow, Ltd.

(57) ABSTRACT

A method for reconstructing a sequence of magnetic resonance (MR) images of an object under investigation, includes the steps of (a) providing a series of sets of image raw data including an image content of the MR images to be reconstructed, the image raw data being collected with the use of at least one radiofrequency receiver coil of a magnetic resonance imaging (MRI) device, wherein each set of image raw data includes a plurality of data samples being generated with a gradient-echo sequence, in particular a FLASH sequence, that spatially encodes an MRI signal received with the at least one radiofrequency receiver coil using a non-Cartesian k-space trajectory, each set of image raw data includes a set of homogeneously distributed lines in k-space with equivalent spatial frequency content, the lines of each set of image raw data cross the center of k-space and cover a continuous range of spatial frequencies, and the positions of the lines of each set of image raw data differ in successive sets of image raw data, and (b) subjecting the sets of image raw data to a regularized nonlinear inverse reconstruction process to provide the sequence of MR images, wherein each of the MR images is created by a simultaneous estimation of a sensitivity of the at least one receiver coil and the image content and in dependency on a difference between a current estimation of the sensitivity of the at least one receiver coil and the image content and a preceding estimation of the sensitivity of the at least one receiver coil and the image content.

19 Claims, 4 Drawing Sheets

U.S. PATENT DOCUMENTS

2007/0057671 A1* 3/2007 Nezafat et al. .............. 324/306
2010/0164495 A1* 7/2010 Takizawa et al. ............ 324/309

OTHER PUBLICATIONS

Bakushinsky et al., "Iterative Methods for Approximate Solution of Inverse Problems", Springer (2004).
Buehrer et al., "Array Compression for MRI With Large Coil Arrays", Magnetic Resonance in Medicine, vol. 57, pp. 1131-1139 (2007).
Frahm et al., "Rapid NMR Imaging Using Stimulated Echoes", Journal of Magnetic Resonance, vol. 65, pp. 130-135 (1985).
Hennig et al., "RARE Imaging: A Fast Imaging Method for Clinical MR", Magnetic Resonance in Medicine, vol. 3, pp. 823-833 (1986).
Jackson et al., "Selection of a Convolution Function for Fourier Inversion Using Gridding", IEEE Transactions on Medical Imaging, vol. 10., No. 3, pp. 473-478 (1991).
Kaiser, "Nonrecursive Digital Filter Design Using the I-Sinh Window Function", Proc. IEEE Int. Symp. Circuits Syst., pp. 20-23 (1974).
Kellman et al., "Adaptive Sensitivity Encoding Incorporating Temporal Filtering (TSENSE)", Magnetic Resonance in Medicine, vol. 45, pp. 846-852 (2001).
Knoll et al., "Improved Reconstruction in Non-Cartesian Parallel Imaging by Regularized Nonlinear Inversion", Poster presented at Proceedings of the 17th ISMRM Scientific Meeting and Exhibition in Honolulu, Hawaii, Apr. 18-24, 2009.
Mansfield et al., "Biological and Medical Imaging by NMR", Journal of Magnetic Resonance, vol. 29, pp. 355-373 (1978).
Mansfield, "Real-Time Echo-Planar Imaging by NMR", British Medical Bulletin, vol. 40, No. 2, pp. 187-190 (1984).
Meyer et al., "Fast Spiral Coronary Artery Imaging", Magnetic Resonance in Medicine, vol. 28, pp. 202-213 (1992).
O'Sullivan, "A Fast Sinc Function Gridding Algorithm for Fourier Inversion in Computer Tomography", IEEE Transactions on Medical Imaging, vol. MI-4, No. 4, pp. 200-207 (1985).
Pruessmann et al., "SENSE: Sensitivity Encoding for Fast MRI", Magnetic Resonance in Medicine, vol. 42, pp. 952-962 (1999).
Riederer et al., "MR Fluoroscopy: Technical Feasibility", Magnetic Resonance in Medicine, vol. 8, pp. 1-15 (1988).
Sorenson et al., "Real-Time Reconstruction of Sensitivity Encoded Radial Magnetic Resonance Imaging Using a Graphics Processing Unit", IEEE Transactions on Medical Imaging, vol. 28, No. 12, pp. 1974-1985 (2009).
Uecker et al., "Image Reconstruction by Regularized Nonlinear Inversion—Joint Estimation of Coil Sensitivities and Image Content", Magnetic Resonance in Medicine, vol. 60, pp. 674-682 (2008).
Wajer et al., "Major Speedup of Reconstruction for Sensitivity Encoding with Arbitrary Trajectories", Pro. Intl. Soc. Mag. Reson. Med, vol. 9, p. 797 (2001).
Zhang et al., "Magnetic Resonance Imaging in Real Time: Advances Using Radial FLASH", Journal of Magnetic Resonance Imaging, vol. 31, pp. 101-109 (2010).

* cited by examiner

METHOD AND DEVICE FOR RECONSTRUCTING A SEQUENCE OF MAGNETIC RESONANCE IMAGES

FIELD OF THE INVENTION

The present invention relates to a method for reconstructing a sequence of magnetic resonance (MR) images. Furthermore, the invention relates to a magnetic resonance imaging (MRI) device configured for implementing the method. Applications of the invention cover the field of MR imaging, in particular medical MR imaging (e.g., cardiovascular imaging) or non-medical investigations in natural sciences (e.g., investigations of a workpiece or a dynamic process).

BACKGROUND OF THE INVENTION

Since the conception of magnetic resonance imaging (MRI) in 1973, a major driving force of its further technical, scientific and clinical development is the quest for speed. Historically, it took more than a decade before the fast low-angle shot (FLASH) MRI technique (DE 3 504 734 or U.S. Pat. No. 4,707,658 A) reduced the acquisition times for a cross-sectional image to the order of one second and allowed a continuous imaging due to the generation of a sufficiently strong steady-state MRI signal. Nevertheless, the monitoring of dynamic processes in real time remained hampered for two reasons: the need for still relatively long measuring times of several hundreds of milliseconds for images with a reasonable spatial resolution and the use of Cartesian encoding schemes that sample the MRI data space (k-space) on a rectilinear grid. Cartesian sampling refers to the acquisition of parallel lines in k-space and was preferred because of its tolerance to instrumental imperfections of early MRI systems and the simple reconstruction of an image by inverse fast Fourier transformation (FFT) of the raw data. Despite these advantages for static images, the continuous monitoring of a moving object is better served with radial encoding schemes as the information content of an individual "spoke" in k-space is of equal importance for the reconstructed image. This is due to the fact that each spoke, but not each parallel line, crosses the center of k-space and therefore contributes both high and low spatial frequencies. Only the latter determine the gross image content such as the position of a moving object.

On the other hand, the use of high-speed acquisition techniques for realtime MRI suffers from a number of specific drawbacks. For example, so-called single-shot gradient-echo sequences such as echo-planar imaging (P. Mansfield et al. in "J. Magn. Reson." vol. 29, 1978, p. 355-373; and in "Br. Med. Bull." vol. 40, 1984, p. 187-190) and spiral imaging (C. B. Ahn et al. in "IEEE Trans. Med. Imag." vol. 5, 1986, p. 2-7; and C. H. Meyer et al. in "Magn. Reson. Med." vol. 28, 1992, p. 202-213) are prone to geometric distortions or even local signal losses that are caused by their inherent sensitivity to off-resonance effects, tissue susceptibility differences, and magnetic field inhomogeneities, which are unavoidable in many parts of the body. Complementary, single-shot MRI sequences that employ radiofrequency-refocused spin echoes (J. Hennig et al. in "Magn. Reson. Med." vol. 3, 1986, p. 823-833) or stimulated echoes (J. Frahm et al. in "J. Magn. Reson." vol. 65, 1985, P. 130-135) and therefore are free from such problems, lead to a pronounced radiofrequency power absorption with the risk of local tissue heating or suffer from a compromised signal-to-noise ratio, respectively.

An essential improvement for MR imaging in real time has been obtained with a combination of fast low-angle shot MRI sequences (FLASH sequences) with radial data sampling and view sharing of successive raw data acquisitions (see S. Zhang et al. in "Journal of magnetic resonance imaging", Vol. 31, 2010, p. 101-109). The radial data sampling allows a moderate undersampling factor (about 2) resulting in an image raw data acquisition of about 250 ms per frame. With a reconstruction of image updates using current image raw data of a part of a frame and preceding image raw data (so-called sliding window method), a temporal resolution of about 50 ms can be obtained resulting in a frame rate of 20 MR images per second. Although the method of S. Zhang et al. provides a sequence of MR images with a video frame rate, disadvantages with regard to the image quality may result from the sliding-window technique. In particular, image reconstruction was performed by gridding, which is a rectilinear interpolation of k-space in combination with a density compensation and inverse FFT. With this method rates of up to 20 frames per second are only obtainable when using the sliding window or fluoroscopy (S. J. Riedereret al. in "Magn. Reson. Med." vol. 8, 1988, p. 1-15) approach, while the true temporal fidelity of the images is still determined by measuring times of 200 to 250 ms. For a repetition time of 2 ms these durations correspond to the necessary acquisition of 100 to 125 radial spokes for an image with a 128 matrix resolution.

Another approach for reducing the raw data acquisition time by undersampling the k-space is based on using a plurality of radio frequency receiver coils each providing a separate receive channel (parallel MR imaging). Radio frequency signals being excited in the field of view (FOV) are simultaneously collected with the radio frequency receiver coils. Reconstructing an MR image of the FOV from the image raw data requires a knowledge of the sensitivities (profiles) of the receiver coils. In practical MRI devices, e.g. for medical imaging, this reconstruction is based on a linear inverse method, wherein the coil sensitivities are calculated in a first step and the MR image is calculated using the fixed coil sensitivities in a subsequent second step. Parallel MR imaging with the linear inverse reconstruction provides an undersampling factor of about 2 to 3.

Recently, a nonlinear inverse method for improved autocalibrated parallel imaging has been described (M. Uecker et al. in "Magnetic resonance in medicine", Vol. 60, 2008, p. 674-682), which combines the use of variable density trajectories with the joint estimation of image content and coil sensitivities. For this algorithm, it could also be shown that only a very small central k-space area with full sampling is required for accurate autocalibration. Both properties are particularly attractive for real-time imaging, where the coil sensitivity information has to be frequently updated to match the actual experimental situation generated by a moving object. The nonlinear inverse method yields an improved image quality and/or increased undersampling factor (about 3 to 4). However, the image reconstruction proposed by M. Uecker et al. (2008) was adapted to image raw data being generated with a gradient-echo sequence using a Cartesian k-space trajectory resulting in the drawbacks of Cartesian k-space trajectories noted above.

In order to apply a nonlinear inverse reconstruction to non-Cartesian k-space data, it has been proposed to add an interpolation step to each iteration of the algorithm (see F. Knoll et al., Poster "Improved reconstruction in non-Cartesian parallel imaging by regularized nonlinear inversion", in "Proceedings of the 17th ISMRM scientific meeting and exhibition", Honolulu, Hi., USA, Apr. 18-24, 2009). Although F. Knoll et al. were capable of reconstructing an MR image with an undersampling factor of about 12, the implementation of the regularized nonlinear inversion required a calculation time of about 40 s resulting in a practical application for reconstructing a single MR image only. Because such computations are rather slow, one may consider the use of a graphical processing unit (GPU) to achieve reasonable reconstruction times. A corresponding implementation for iterative SENSE (K. P. Pruessmann et al. in "Magn. Reson. Med." vol. 42, 1999, p. 952-962) has indeed been utilized for real-time imaging (T. S. Sorensen et al. "Real-time reconstruction of sensitivity encoded radial magnetic resonance imaging using a graphics processing unit" in "IEEE Trans. Med. Imag." vol. 28(12), 2009, p. 1974-1985). However, an efficient implementation of the interpolation algorithm on a GPU is a difficult and time-consuming task.

OBJECTIVE OF THE INVENTION

The objective of the invention is to provide an improved method for reconstructing a sequence of MR images, in particular for medical imaging purposes, which is capable of avoiding disadvantages of conventional techniques. In particular, the objective is to provide a method for reconstructing a sequence of MR images which enables a continuous acquisition of MR images with reduced acquisition times, thus allowing the provision of an image sequence with a practical frame rate. Furthermore, the objective of the invention is to provide an improved MRI device, in particular being adapted for conducting the method for reconstructing a sequence of MR images.

SUMMARY OF THE INVENTION

The above objective is solved by an MR image reconstruction method and/or an MRI device comprising the features of the independent claims. Advantageous embodiments of the invention are defined in the dependent claims.

According to a first aspect of the invention, a method for reconstructing a sequence of MR images of an object under investigation is disclosed, which comprises the steps of providing a series of sets of image raw data including an image content of the MR images to be reconstructed, said image raw data being collected with the use of at least one radiofrequency receiver coil of an MRI device, and subjecting the sets of image raw data to a nonlinear inverse reconstruction process to provide the sequence of MR images, wherein each is created by a simultaneous estimation of a sensitivity of the at least one receiver coil and the image content. The nonlinear inverse reconstruction process is an iterative process which in each iterative step solves a regularized linearization of a nonlinear MRI signal equation which maps the unknown spin density to be measured and coil sensitivities to the data acquired from the at least one receiver coil.

According to the invention, each set of image raw data includes a plurality of data samples being generated (measured) with a gradient-echo sequence that spatially encodes an MRI signal received with the at least one radiofrequency receiver coil using a non-Cartesian k-space trajectory. Furthermore, each set of image raw data comprises a set of lines in k-space with equivalent spatial frequency content, wherein the lines of each set of image raw data cross the center of k-space and cover a continuous range of spatial frequencies, and the positions of the lines of each set of image raw data differ in successive sets of image raw data. Preferably, the lines of each set of image raw data are homogeneously distributed in k-space. Subsequent sets of image raw data are collected along different non-Cartesian k-space trajectories each covering the continuous range of spatial frequencies. The continuous range of spatial frequencies of each line includes low spatial frequencies (frequencies in a central portion of k-space) and high spatial frequencies (frequencies in an outer portion of k-space) for obtaining a predetermined spatial resolution of the resulting MR images.

Furthermore, according to the invention, the nonlinear inverse reconstruction process includes a regularization, wherein the MR images are iteratively reconstructed in dependency on a difference between a current set (estimation) of the sensitivity of the at least one receiver coil and image content and a preceding set (estimation) of the sensitivity of the at least one receiver coil and image content. In other words, a preceding MR image, preferably the directly preceding MR image, is used as a reference image for the regularization introduced for iteratively calculating a current MR image with nonlinear inversion. Contrary to the regularized nonlinear inversion proposed by F. Knoll et al. (2008), the regularization term used in the inventive reconstruction of MR images (except of the first image) depends on a non-zero reference image, in particular the preceding MR image.

Preferably, the nonlinear inversion is based on a nonlinear inverse reconstruction for autocalibrated parallel imaging extended to non-Cartesian k-space encodings, which comprises an implementation on a graphical processing unit (GPU) to reduce reconstruction times, and/or the use of a convolution-based iteration, which considerably simplifies the GPU implementation compared to a gridding technique. Advantageously, the extension of the non-linear reconstruction method to the non-Cartesian radial trajectory can be accomplished by only one single interpolation performed in a preparatory step before the iterative reconstruction, while the subsequent iterative reconstruction (optimization) relies on a convolution with a point-spread function (Fourier transform of the non-Cartesian sampling pattern).

Advantageously, the teaching of the invention combines two major principles: (i) a gradient-echo sequence MRI technique with pronounced undersampling using non-Cartesian trajectories for spatial encoding, and (ii) an image reconstruction which estimates the image by the regularized nonlinear inversion. The former technique allows for rapid, continuous and motion-robust imaging without sensitivity to off-resonance artifacts. The latter technique allows an enhancement of the degree of radial undersampling in an hitherto unexpected manner to about a factor of 20 and implicitly exploits the advantages of parallel imaging with multiple receive coils (if used).

Contrary to the conventional reconstruction of a single MR image (F. Knoll et al., see above), the inventors have found that the nonlinear inverse reconstruction process applied to a series of sets of image raw data collected along the different non-Cartesian k-space trajectories results in an MR image sequence of essentially improved image quality as the result of preceding image reconstruction steps improves the further MR images of the sequence.

According to a second aspect of the invention, an MRI device is provided which is configured for creating a sequence of MR images of an object under investigation and which comprises an MRI scanner and a control device being adapted for controlling the MRI scanner for collecting the series of sets of image raw data and reconstructing the sequence of MR images with the method according to the above first aspect of the invention. The MRI scanner includes a main magnetic field device, at least one radiofrequency excitation coil, at least two magnetic field gradient coils and at least one radiofrequency receiver coil.

According to a preferred embodiment of the invention, the reconstruction process includes a filtering process suppressing image artifacts. The filtering process comprises at least one of a spatial and a temporal filter. With a particularly preferred variant, a temporal median filter is applied to the reconstruction process.

Advantageously, there are no further particular requirements with regard to the shape of the lines in k-space, which in particular can be selected in dependency on the concrete application conditions. If the lines of each set of image raw data correspond to rotated straight lines, also known as "radial spokes", advantages in terms of a minimum sampling time per line can be obtained.

The term "set of image raw data" refers to the image raw data which covers the k-space information of the image within the desired FOV. Thus, each set of image raw data provides one frame (i.e. one of the MR images in the sequence of MR images). Advantageously, the invention can be implemented with various embodiments wherein one single slice or different slices are represented by the frames. According to a first variant, the sequence of MR images is a time series of one single cross-sectional slice of the object. According to a further variant, the sequence of MR images represents a series of multiple cross-sectional slices of the object.

According to yet a further variant, which represents a particularly advantageous embodiment of the invention, the sequence of MR images represents a time series of multiple cross-sectional slices of the object, wherein the image raw data are collected in such a way that successive lines in k-space are from different slices (interleaved multi-slice data sets), or such that successive sets of image raw data are from different slices (sequential multi-slice data sets).

With the interleaved multi-slice data sets, different slices are measured with each line in k-space, i.e. with each repetition time of the gradient-echo sequence. This embodiment is preferably used for collecting image sequences of a certain repeated motion, e.g. of a joint in medical imaging. With the sequential multi-slice data sets, different slices are measured with each set of image raw data, which is preferably used for collecting image sequences for perfusion measurements, e.g. after introduction of a contrast agent into heart, liver or mamma tissue.

The regularization may comprise at least one of a temporal and a spatial regularization. As an example, temporal regularization may be provided if subsequent sets of image raw data represent a time series of one single slice or multiple slices within the object. In the latter case, one time series of sets of image raw data is provided for each slice after collecting the image raw data, and the temporal regularization is provided within each time series. As a further example, spatial regularization may be provided if subsequent sets of image raw data represent different slices within the object, which are adjacent to each other. A preceding image of a first slice is used as reference image for regularizing a current image of an adjacent slice.

As a further advantage of the invention, the method for reconstructing a sequence of MR images can be implemented with different gradient-echo sequences. A particular gradient-echo sequence, like e.g. a single-echo FLASH (fast low-angle shot) sequence, a multi-echo FLASH sequence, a FLASH sequence with refocusing gradients, a FLASH sequence with fully balanced gradients, or a true-FISP sequence, can be selected in dependency on the imaging task.

If according to a further preferred embodiment of the invention each set of image raw data comprises an uneven number of lines with an equal axial distribution, line coincidences in the k-space trajectory within one set of image raw data are avoided.

As a further advantage of the invention, the image raw data can be selected by an essentially reduced degree of undersampling which—e.g. for rotated straight lines and according to the sampling theorem—is given by $\pi/2$ times the number of data samples per line. The degree of undersampling can be at least a factor of 5, in particular at least a factor of 10, thus accelerating the data acquisition compared with the method described by S. Zhang et al. (see above) by one order of magnitude. Furthermore, the number of lines of each set of image raw data can be reduced. In particular for medical imaging, it has been found that a number of lines equal or below 30, in particular equal or below 20 is sufficient for obtaining high quality MR image sequences.

Furthermore, a duration of collecting each set of image raw data is essentially shortened compared with conventional techniques. The acquisition time can be equal or below 100 ms, in particular be equal or below 50 ms, or even be equal or below 30 ms. Thus, the invention offers a solution to real-time MRI which refers to the continuous acquisition of images with short acquisition times. The practice of the invention yields high-quality images with acquisition times even as short as 20 ms corresponding to movies with 50 frames per second. Potential applications cover a broad range of fields from medicine (e.g., cardiovascular imaging without synchronization to the electrocardiogram and during free breathing) to the natural sciences (e.g., studies of turbulent flow).

According to a further preferred embodiment of the invention, the lines of each set of image raw data can be selected such that the lines of successive sets of image raw data are rotated relative to each other by a predetermined angular displacement such that a combination of such sets of image raw data again represent a homogeneous coverage of k-space information of the desired image. As an advantage, this rotation improves the effect of the filtering process within the image reconstruction. However, it is not strictly necessary that all images of a sequence are collected along mutually different k-space trajectories. In particular, the number of successive sets of image raw data with different positions of lines can be selected in the range of 2 to 15, in particular in the range of 3 to 7.

The inventive method for reconstructing a sequence of MR images can be conducted during and/or immediately after collecting the image raw data with the at least one radiofrequency receiver coil of the MRI device. In this case, providing the series of sets of image raw data comprises the steps of arranging the object in the MRI device including the at least one receiver coil, subjecting the object to the gradient-echo sequence, and collecting the series of sets of image raw data using the at least one receiver coil. Reconstructing the sequence of MR images can be conducted in real time, i.e. with a negligible delay relative to the image raw data collection (online reconstruction). Alternatively, the reconstruction may require some time resulting in a certain delay in presenting the sequence of MR images (offline reconstruction). In this case, a simultaneous online presentation of images reconstructed according to a conventional method, e.g. according to the technique of S. Zhang et al. can be provided.

According to an alternative embodiment, the inventive method for reconstructing the sequence of MR images can be conducted independently of collecting the image raw data with predetermined measurement conditions. In this case, the sets of image raw data can be received e.g. from a data storage and/or a data transmission from a distant MRI device.

The invention provides the following further advantages. Firstly, the inventive solution to real-time MRI offers pronounced motion robustness, high image quality, no sensitivities to artifacts as known from alternative high-speed MRI techniques, and a flexible temporal resolution, spatial resolution, and image contrast. The key to this achievement is the combination of e.g. a radial FLASH MRI acquisition with the image reconstruction by the regularized nonlinear inversion, which leads to a hitherto unexpected potential to reduce the number of spokes per image. In fact, the method combines several advantages: the continuous update of the coil sensitivities for all time frames, the implicit data reduction capacity of parallel MRI acquisitions, the tolerance of radial encodings to undersampling, the enhanced tolerance of the nonlinear algorithm to undersampling, and the temporal filtering in conjunction with an interleaved encoding scheme for sequential frames. Taken together, the inventive method improves the temporal resolution of MRI by one order of magnitude in comparison to preceding gridding reconstructions.

Furthermore, the inventive real-time MRI method described here has new applications in different areas of research. For example, non-medical applications may address the hydrodynamic properties of mixed fluids in a variety of physicochemical systems and in particular focus on a three-dimensional characterization of turbulent flow phenomena. On the other hand, the widespread availability of clinical MRI systems will lead to a pronounced influence on biomedical and clinical imaging scenarios. This is further supported by the ease of implementation of the acquisition technique and the expected refinement of the existing computer hardware for speeding up iterative reconstructions. Immediate impact is obtained on cardiovascular MRI because of the ability to assess myocardial functions in real time with high temporal resolution. In fact, results of the inventors indicate the potential to even monitor the functioning of the cardiac valves and to determine the properties of (turbulent) blood flow in the heart and large vessels. Moreover, based on the insensitivity of the proposed method to susceptibility-induced image artifacts, applications in interventional MRI are possible, which refers to the real-time monitoring of minimally invasive surgical procedures.

The inventive real-time MRI method also offers other possibilities such as the dynamic assessment of joint movements and the online visualization of rapid physiological processes, for example after administration of an MRI contrast agent. In fact, if specific applications do not require the maximum temporal resolution, the use of a lower frame rate may be translated into better spatial resolution or the simultaneous recording of movies in multiple sections. Alternatively, real-time MRI may also be combined with the encoding of additional information, for example about flow velocities using phase-contrast techniques.

BRIEF DESCRIPTION OF THE DRAWINGS

Further details and advantages of the invention are described in the following with reference to the attached drawings, which show in.

DESCRIPTION OF THE PREFERRED EMBODIMENTS

Preferred embodiments of the invention are described in the following with particular reference to the design of the k-space trajectories, the mathematical formulation of the regularized non-linear inverse reconstruction and examples of images obtained with the inventive technique. Details of an MRI device, the construction of gradient echo sequences and their adaptation to a particular object to be imaged, the numerical implementation of the mathematical formulation using available software tools and optional further image processing steps are not described as far as they are known from conventional MRI techniques. Furthermore, exemplary reference is made in the following to parallel MR imaging wherein the image raw data comprise MRI signals received with a plurality of radio frequency receiver coils. It is emphasized that the application of the invention is not restricted to parallel MR imaging, but rather possible even with the use of one single receiver coil.

Figure 1:
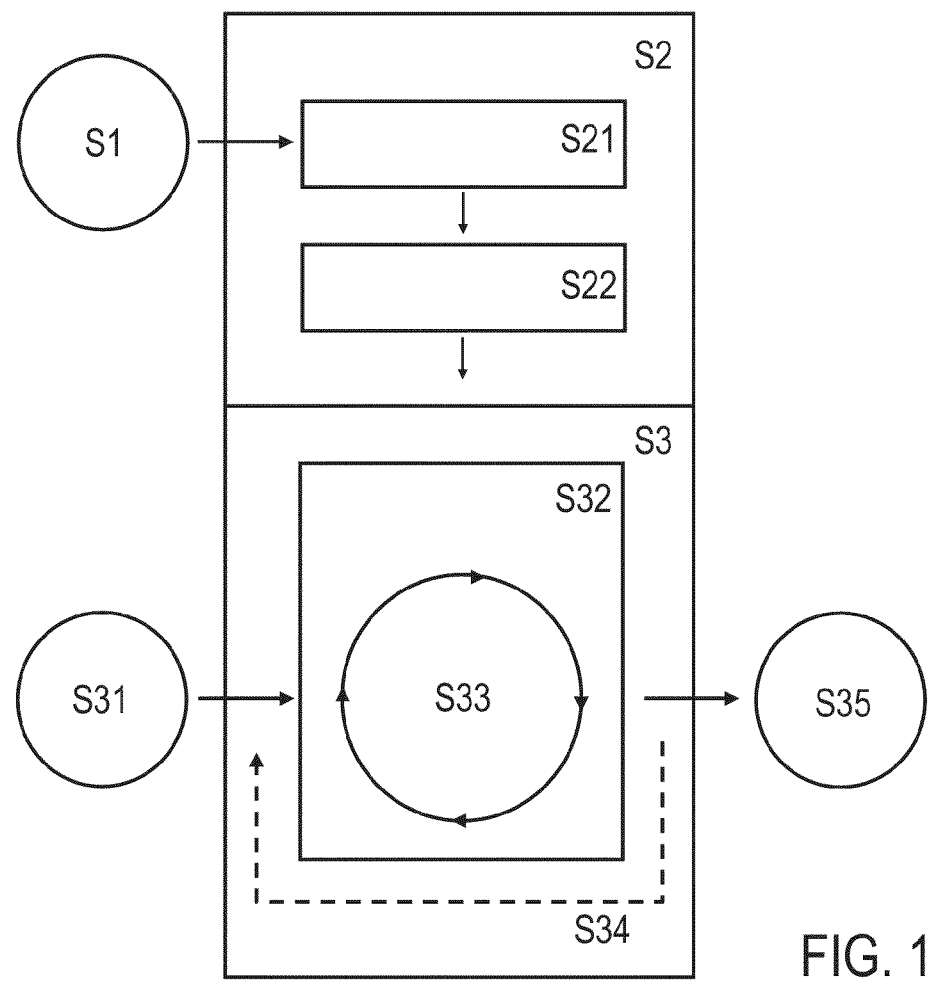
FIG. 1: a schematic illustration of a preferred embodiment of the MR image reconstruction method according to the invention.
Figure 2:
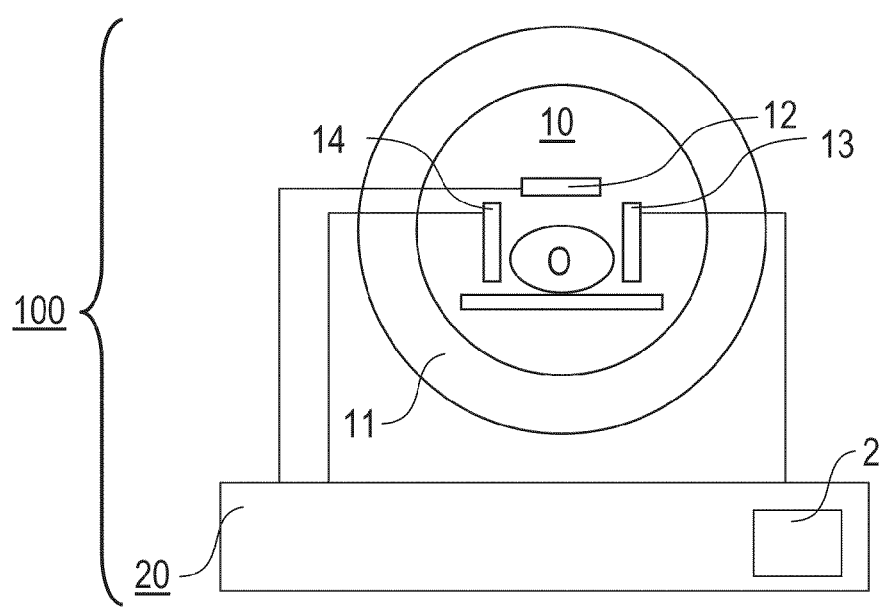
FIG. 2: a schematic illustration of a preferred embodiment of an MRI device according to the invention.

FIG. 1 summarizes a complete data flow of the inventive reconstruction process comprising a first step S1 of collecting the measured data, a second step S2 of preprocessing the measured data, and a third step S3 of iteratively reconstructing a sequence of MR images. FIG. 2 schematically shows an MRI device 100 with an MRI scanner 10 including a main magnetic field device 11, at least one radiofrequency excitation coil 12, at least two magnetic field gradient coils 13 and radiofrequency receiver coils 14. Furthermore, the MRI device 100 includes a control device 20 being adapted for controlling the MRI scanner 10 for collecting the series of sets of image raw data and reconstructing the sequence of MR images with the method according to FIG. 1. The control device 20 includes a GPU 21, which is preferably used for implementing the regularized nonlinear inversion.

With step S1, a series of sets of image raw data including an image content of the MR images to be reconstructed is collected with the use of the radiofrequency receiver coils 14 of the MRI device 100. The object O, e.g. a tissue or organ of a patient, is subjected to a radiofrequency excitation pulse and a gradient-echo sequence encoding the MRI signal received with the radiofrequency receiver coils 14. The gradient-echo sequence is constructed such that data samples are collected along non-Cartesian k-space trajectories. Examples are shown in FIGS. 3A, 3B and 4B.

Figure 3:
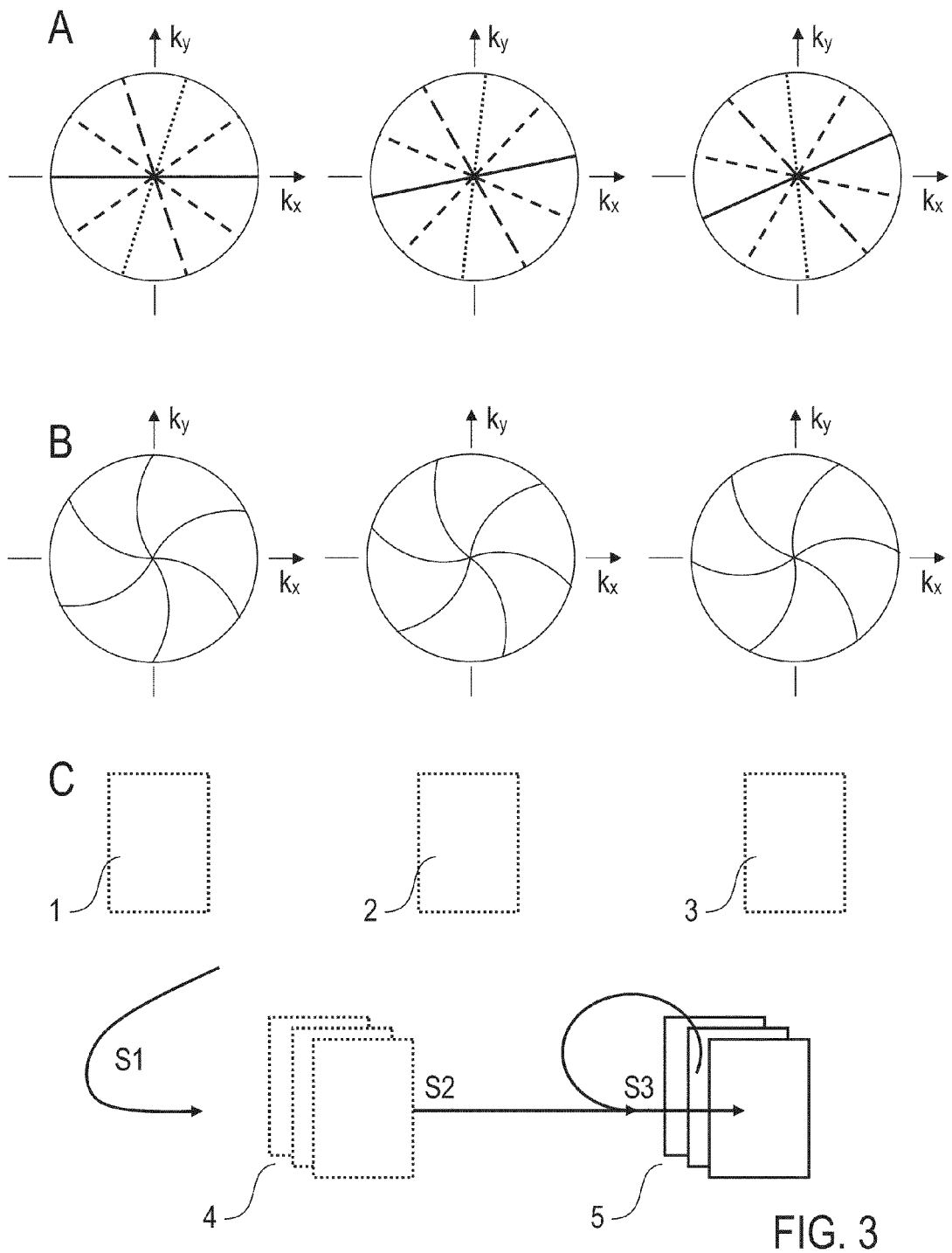
FIG. 3: schematic illustrations of further details of the method according to FIG. 1.
Figure 4:
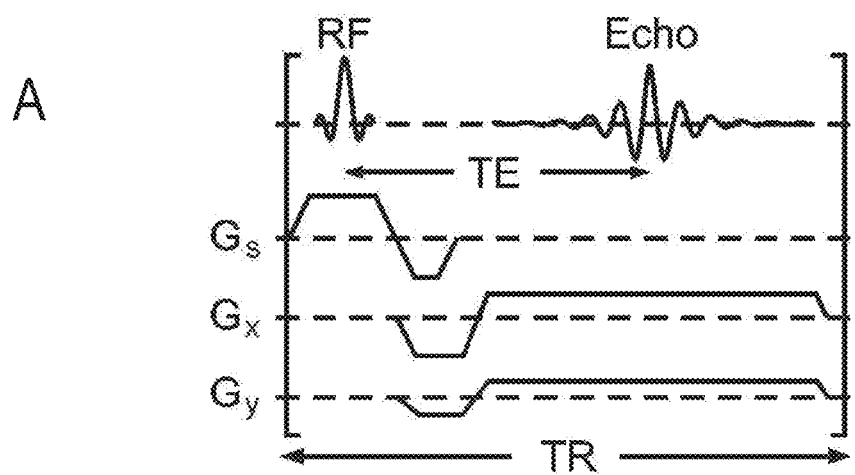
FIGS. 4A to 4D: examples of a gradient echo sequence, a radial k-space trajectory and MR images.
Figure 4:
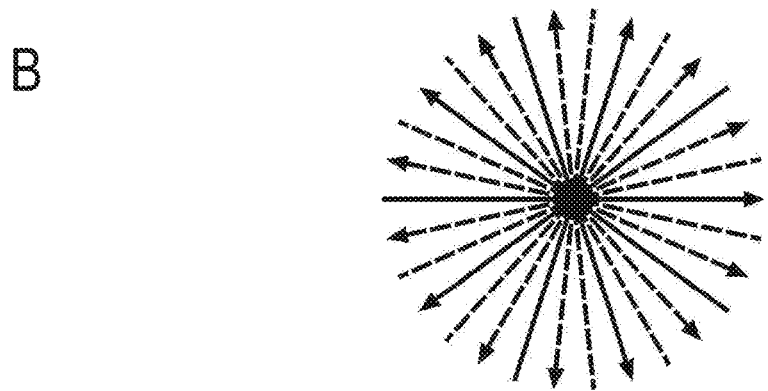
Figure 4:
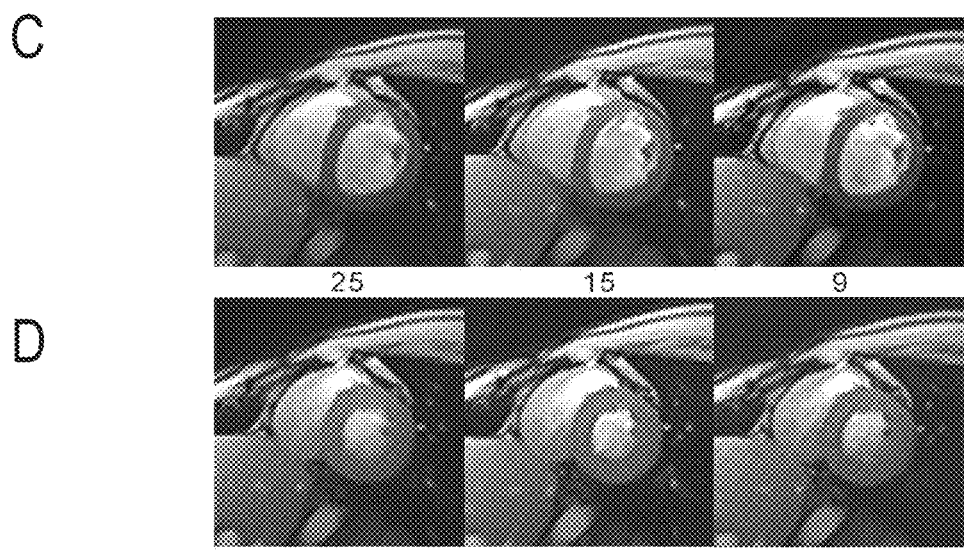

FIG. 3A schematically illustrates a first example of the k-space trajectories which comprise radial spokes extending in the $k_x$-$k_y$-plane of the k-space. For illustrative purposes, 5 spokes are shown in FIG. 3A. In practice, the number of spokes can be selected in dependency on the degree of undersampling being sufficient for a particular imaging task. Each of the spokes crosses the center of k-space, while all spokes have equivalent spatial frequency contents covering a range of low and high spatial frequencies. FIG. 3B schematically illustrates another example of the k-space trajectory comprising curved spiral lines, all of which crossing the center of the k-space and having equivalent spatial frequency contents. FIGS. 3A and 3B further illustrate that the positions of the lines of each set of image raw data differ in timely successive sets of image raw data. The lines are rotated by a predetermined angular displacement. Again, the angular displacement can be selected in dependency on the particular degree of undersampling. FIG. 3C schematically shows that each raw data collection along the radial spokes distributed over 360° results in a set 1, 2, 3, ... of image raw data. Due to the angular displacement, all sets 1, 2, 3, ... of image raw data will result in image estimates with slightly different reconstruction errors. The time series 4 of collected sets of image raw data is subjected to the subsequent steps S2 and S3.

With step S2, the image raw data are subjected to an optional whitening and array compression step S21 and to an interpolation step S22, wherein an interpolation of the non-Cartesian data onto a Cartesian grid is conducted. First, the whitening step S21 (see FIG. 1) is used to decorrelate the acquired data. Starting from an eigendecomposition $U\Sigma U^H$ of the noise correlation matrix the receive channels are transformed according to $\Sigma^{-1/2} U^H$. Secondly, to reduce the computation time, according to the invention a principal component analysis can be applied to the data of the first frame. Only the first principal components are then used for the reconstruction process. This is a standard technique from multivariate analysis and known as array compression in the context of MRI (see S. Zhang et al., cited above, and M. Buehrer et al. in "Magn. Reson. Med." vol. 58, 2007, p. 1131-1139). Given an eigendecomposition $U\Sigma U^H$ of the covariance matrix of the data the receive channels are transformed according to $U^H$. From these virtual channels only a subset corresponding to the highest eigenvalues are used for reconstruction. The above processing steps linearly recombine the physical receive channels to fewer virtual channels. Because the coil sensitivity estimation is integrated into the nonlinear reconstruction, no further changes are necessary. The algorithm simply estimates the virtual sensitivities of the transformed channels instead of the physical sensitivities.

As the final preprocessing step S22, the data is interpolated onto the Cartesian grid. However, in contrast to the conventional gridding technique, no density compensation has to be used. The reconstruction by nonlinear inversion is extended to non-Cartesian trajectories by a technique similar to convolution-based sensitivity encoding (Wajer F, Pruessmann K P. "Major speedup of reconstruction for sensitivity encoding with arbitrary trajectories" in "Proceedings of the ISMRM 9th Annual Meeting", Glasgow, Scotland 2001; 767). Conventional iterative algorithms for non-Cartesian MRI interpolate the estimated Fourier data, which are represented on a Cartesian grid, to the actual non-Cartesian k-space positions in each iteration step. In contrast, the alternative technique used here moves the interpolation into the single preceding processing step S22, while all iterative computations are done on the Cartesian grid. For this purpose, the projection to the non-Cartesian sample positions is formulated as a convolution of the image with the Fourier transform of the non-Cartesian sampling pattern, also termed point-spread function. After increasing the Cartesian grid (processing matrix) by zero-padding and truncating the point-spread function accordingly, the result of this restricted convolution can be computed efficiently with the help of a FFT algorithm. This modification facilitates the parallelization and implementation of the algorithm on graphical processing units (GPUs), which may be exploited to realize considerable reductions of the reconstruction time.

Finally, with step S3, the sequence 5 of MR images of the object O is reconstructed by the regularized nonlinear inverse reconstruction process, which is described with further detail below. Starting from an initial guess S31 for the MR image and the coil sensitivities, each of the MR images is created by an iterative simultaneous estimation S32 of sensitivities of the receiver coils and the image content. Step S32 comprises the nonlinear inverse reconstruction using an iteratively regularized Gauss-Newton method including a convolution-based conjugate gradient algorithm S33. The number of iterations (Newton steps) is selected in dependency on the image quality requirements of a particular imaging task. Finally, the reconstructed series of MR images is output (S35). Further steps of conventional processing, storing, displaying, or recording of image data can follow.

Further details of steps S32, S33 are described below (1.1 to 1.3). The regularization S34 is introduced in algorithm S33 with a current reference image as described below (1.4). It is emphasized that the implementation of the invention is not restricted to the use of the algorithms described below. Alternative implementations of non-linear inverse reconstructions, like e.g. proposed by F. Knoll et al. can be used with a preceding reference image based regularization as well.

1. Nonlinear Inverse Reconstruction for Real-Time MRI 1.1 Basic Mathematical Formulation of the Preferred Nonlinear Inverse Reconstruction M. Uecker et al. (2008) could demonstrate that parallel MRI reconstructions may significantly be improved, if image content and coil sensitivities are jointly estimated from the entire available data. As a consequence, the MRI signal equation becomes a nonlinear equation, which may be solved with numerical methods such as the iteratively regularized Gauss Newton method. Because the reconstruction requires an initial guess, the image is initialized to one and the coil sensitivities to zero (step S31), while for the time series this may be replaced by the previous frame (step S34, see 1.4 below). The disclosure of the publication of M. Uecker et al. ("Magnetic resonance in medicine", Vol. 60, 2008, p. 674-682) is introduced to the present specification by reference.

As commonly required for an ill-conditioned inverse problem, a regularization term controls the noise enhancement during inversion at the cost of some bias towards a given reference (usually the initial guess). In the nonlinear inversion algorithm the regularization strongly penalizes high frequencies in the coil sensitivities, while using a conventional L2-regularization for the image. The inventors have found that a strength of the algorithm proposed by M. Uecker et al. (2008) is its inherent flexibility, which allows for arbitrary sampling patterns and k-space trajectories. In fact, the specific application to a radial trajectory leads to a completely self-contained reconstruction process, so that the real-time data can be processed without any special calibration of the coil sensitivities. The extension of the previous reconstruction method to a non-Cartesian radial trajectory is accomplished by only a single interpolation performed in the preparatory step S22 (see FIG. 1), while the subsequent iterative optimization relies on a convolution with the point-spread function (PSF). In terms of computational demand and in contrast to an interpolation, the convolution mainly involves two applications of a fast Fourier transform (FFT) algorithm. It therefore allows for a very simple GPU implementation, which then may be exploited to realize considerable reductions of the reconstruction time.

1.2 Nonlinear Inversion (Steps S32, S33)

The MRI signal equation is a nonlinear equation, which maps the unknown spin density $\rho$ and coil sensitivities $c_j$ to the data acquired from all receive coils $$F: x := (\rho, c_1, \ldots, c_N) \mapsto (y_1, \ldots, y_N) \qquad [1]$$

The operator is given by $$F: x \mapsto \begin{pmatrix} P_{\vec{k}} \mathcal{F} P_{FOV}\{c_1 \cdot \rho\} \\ \vdots \\ P_{\vec{k}} \mathcal{F} P_{FOV}\{c_N \cdot \rho\} \end{pmatrix} \quad [2]$$

with $$x = \begin{pmatrix} \rho \\ c_1 \\ \vdots \\ c_N \end{pmatrix}$$

where F is the (multidimensional) Fourier transform and $P_{\vec{k}}$ the orthogonal projection onto the trajectory. Solving this nonlinear equation jointly for the spin density and coil sensitivities improves the accuracy of both estimated quantities compared with traditional algorithms for autocalibrated parallel imaging (M. Uecker et al., 2008). Moreover, because the algorithm moves most of the low frequency variations into the estimated coil sensitivities, it produces a very homogeneous image.

The solution to Eq. [1] is calculated with the Iteratively Regularized Gauss Newton Method (IRGNM, step S32) (Bakushinsky A B, Kokurin M Y. Iterative Methods for Approximate Solution of Inverse Problems. Dordrecht: Springer; 2004). It is applied to the operator equation modified by an additional positive definite weighting matrix $G=F \circ W^{-1/2}$. The reconstruction employs an initial guess $x_0$, which is improved in an iterative process by solving a regularized linearization of the signal equation. The improved estimation $x_{n+1}$ is given by the update rule $$x_{n+1} - x_n = (DG_{x_n}{}^H DG_{x_n} + \alpha_n I)^{-1}(DG_{x_n}{}^H(y - Gx_n) - \alpha_n x_n) \quad [3]$$

According to the invention, a modified update rule is applied for the efficient reconstruction of a time series of sets of image raw data, wherein the previous frame is used as the reference guess in the reconstruction of successive frames (see 1.4).

The weighting matrix $W^{1/2}$ constrains the solutions of this bilinear equation to comply with prior information. It is a block matrix consisting of two submatrices: The first penalizes high frequencies in the coil sensitivities according to $(1+a \cdot \|k\|^2)^l$ with properly chosen constants, and the second contains a regularization term for the image. Here, this term is the identity matrix, which corresponds to a conventional $L_2$-regularization for the image.

The regularization parameter $\alpha$ is reduced in each iteration according to $\alpha_n = \alpha_0 q^n$ with $q \in (0,1)$. Thus, the regularization of the last iteration determines the trade-off between noise and artifact in the reconstructed image. It is commonly controlled by changing the number of iterations, while keeping the initial regularization $\alpha_0$ fixed.

1.3 Extension to Non-Cartesian Trajectories

An extension of the algorithm to non-Cartesian trajectories is achieved by adding an interpolation (see F. Knoll et al., cited above) to the operator that performs a regridding of the k-space data. Alternatively, this work employs a technique, which is similar to the convolution-based SENSE algorithm described earlier (Wajer F, Pruessmann K P. "Major speedup of reconstruction for sensitivity encoding with arbitrary trajectories" in "Proceedings of the ISMRM 9th Annual Meeting", Glasgow, Scotland 2001; 767).

Starting from a continuous description, the forward operator F can be decomposed into a (nonlinear) operator C, which contains the multiplication of the object with the sensitivities, a projection $P_{FOV}$ onto the FOV, the Fourier transformation $\mathcal{F}$, and a projection $P_{\vec{k}}$ onto the trajectory:

$$F = P_{\vec{k}} \mathcal{F} P_{FOV} C \quad [4]$$

Multiplication of this operator with the weighting matrix $W^{1/2}$ and insertion of the result into the update rule for the IRGNM yields $$dx = (W^{-1/2} DC_{x_n}{}^H P_{FOV} \mathcal{F}^{-1} P_{\vec{k}} \mathcal{F} P_{FOV} DC_{x_n} W^{-1/2} + \alpha_n I)^{-1}$$

$$(W^{-1/2} DC_{x_n}{}^H P_{FOV} \mathcal{F}^{-1}(y - P_{\vec{k}} \mathcal{F} P_{FOV} \circ CW^{-1/2} x_n) - \alpha_n x_n) \quad [5]$$

The process takes advantage of the idempotence and self-adjointness of an orthogonal projection ($PP = P$ and $P^H = P$) and the fact that the data y is already given on the trajectory $P_{\vec{k}} y = y$.

As for convolution-based SENSE the term $\mathcal{F}^{-1} P_{\vec{k}} \mathcal{F}$ can be understood as a convolution with the PSF. Because this convolution only needs to be evaluated on an area with compact support, it can—after discretization—efficiently be implemented with the use of a FFT. In a preparatory step, therefore, the vector y is discretized by interpolating the data onto a grid and the PSF is calculated.

1.4 Temporal Regularization and Filtering

As outlined above, the image and coil sensitivities are calculated by N iteration steps of the Gauss-Newton method. For introducing the regularization, the update rule [3] is modified according to Eq. [6]. Each step consists of solving the following linear equation (e.g. iteratively with the conjugate gradient algorithm) for the next estimate $x_{n+1}$ using the data y, a reference $x_{ref}$ and an initial guess $x_0$.

$$x_{n+1} - x_n = (DG_{x_n}{}^H DG_{x_n} + \alpha_n I)^{-1}(DG_{x_n}{}^H(y - Gx_n) - \alpha_n(x_n - x_{ref})) \quad [6]$$

The next estimate $x_{n+1}$ obtained by solving this equation can be understood as the minimizer of the functional (see M. Uecker et al., 2008)

$$\|DG_{x_n}(x_{n+1} - x_n) - (y - Gx_n)\|^2 + \alpha_n \|x_{n+1} - x_{ref}\|^2 \quad [7]$$

with y: raw data from multiple coils; $x_0$: initial guess (image and sensitivities); $x_n$: current estimate (image and sensitivities) used in the n+1-th Gauss-Newton step; $x_{n+1}$: estimate (image and sensitivities) obtained in the n+1-th Gauss-Newton step; $x_N$: final estimate calculated in the last (N-th) Gauss-Newton step; $x_{ref}$: reference image used in the regularization; $\alpha_n$: regularization parameter (reduced in each iteration step); G: forward operator (multiplied with a weighting matrix); DG: derivative of the operator at $x_n$, and $DG^H$: adjoint of the derivative.

The regularization introduces a priori knowledge and is critical for good image quality. In the functional [7] the regularization term can be understood as a penalty term. While in the above basic algorithm (see 1.1), the reference image and sensitivities in the regularization term have been omitted (reference $x_{ref} = 0$, corresponding penalty term $\alpha_n \|x_{n+1}\|^2$, see Eq. [3]), the inventive regularization uses the final estimate $x^{prev}{}_N$ of the image and sensitivities of the previous frame as reference (optionally multiplied by a scaling factor b, $|b| \leq 1$):

$$x_{ref} = b x^{prev}{}_N \quad [8]$$

With a suitable initial guess the number of Gauss-Newton steps and the time for image reconstruction can be reduced. For the first frames of a time series the image components of $x_0$ are set to 1 and coil sensitivity components of $x_0$ are set to 0 (as in the reconstruction of static images). For later frames the same reference as used in the regularization term is also used as initial guess: $x_0 = bx^{prev}_{ref}$.

The final reconstructed image I (step S35) is usually obtained by taking the absolute values of the complex-valued components of $x_N$ which correspond to the image (optionally weighted by the coil sensitivities).

To further enhance the image quality, a combination of two techniques can be used. The radial spokes are rotated by some angle in the acquisition of successive frames. This causes residual artifacts to change their appearance from one frame to the next, which allows them to be removed by temporal filtering (median filter). The pixel values of one frame are replaced by the median of the corresponding values of the k preceding and the k following frames:

$$I^{filtered} = \text{median}\{I^{-k}, \ldots, I^{-1}, I, I^{+1}, \ldots, I^{+k}\} \text{ (preferably pixel-wise)} \quad [9]$$

1.5 Implementation on a Graphical Processing Unit

The adaptation of the algorithm to non-Cartesian data by the convolution with the PSF separates the interpolation from the iterative optimization. The remaining part of the algorithm may therefore be accelerated by a GPU implementation using a code that is nearly identical to that required for Cartesian data.

Efficient programming of the GPU, which is a massively data-parallel processor, was considerably facilitated by the choice of the convolution-based algorithm. Thus, apart from the few CPU-based preprocessing and initialization steps, the GPU-based iterative optimization simplified to (i) point-wise operations, (ii) FFT applications, and (iii) calculations of scalar products. Each of these operations is either easy to implement or readily available through the programming library of the GPU vendor. Because the interpolation of a gridding technique is difficult to implement on a GPU but not time critical, it may be executed on the CPU during preprocessing.

Because of its ability to accurately estimate coil sensitivities and image content from a single acquisition with only a very small area in the central k-space that needs to be fully sampled, the nonlinear inverse reconstruction for autocalibrated parallel imaging emerges as an ideal choice for real-time MRI with radial trajectories. The experimental results for real-time MRI of the human heart fully confirm the improved image quality and reconstruction speed. Alternative reconstruction techniques such as TSENSE (P. Kellman et al. in "Magn. Reson. Med." vol. 59, 2001, p. 846-852) have to combine data from multiple time frames to estimate accurate coil sensitivities and therefore are susceptible to miscalibration errors at sudden sensitivity changes. In practice, this indeed poses a problem, because the frequent—if not permanent—generation of new experimental conditions is an inherent property of MRI studies monitoring dynamic processes. Changes in image content and/or coil sensitivities may be due to organ movements or—in interventional MRI—the positioning of a surgical instrument or the interactive alteration of an imaging parameter. The present algorithm avoids these problems by reconstructing each frame in a completely self-contained process.

2. Experimental Results Obtained with Regularized Nonlinear Inversion

2.1 Radial FLASH MRI

All MRI studies were conducted at 3 T with the use of an unmodified commercially available MRI system (Tim Trio, Siemens Healthcare, Erlangen, Germany) and a body coil for radiofrequency (RF) excitation. Magnetic field gradients were applied in "normal" mode rather than with the fastest possible switching times to avoid peripheral nerve stimulation in human studies under all circumstances (e.g., for double oblique section orientations in cardiac real-time MRI at high frame rates). A RF-spoiled FLASH MRI sequence for data acquisition was used as shown in FIG. 4A (MRI sequence with radial data encoding: RF=radiofrequency excitation pulse, Echo=gradient echo, TE=echo time, TR=repetition time, Gs=slice-selective gradient, Gx and Gy=encoding gradients) yielding spin-density or T1 contrast depending on the repetition time TR and flip angle of the RF excitation pulse. The implementation employed a strongly undersampled radial encoding scheme with an interleaved multi-turn arrangement for 5 successive images (FIG. 4B). The radial encoding scheme covers the data space with spokes that are homogeneously distributed over 360°, while successive frames employ interleaved arrangements. Arrows indicate readout directions. Each single turn corresponds to a full image and contains only a small number of spokes (typically 9 to 25) that are equally distributed over a full 360° circle in order to homogeneously sample the k-space.

The interleaved strategy bears several advantages. First, residual streaking artifacts due to reconstructions from very small datasets will differ from frame to frame and may be removed by mild temporal filtering. Second, interleaved schemes offer the possibility for retrospective reconstructions with different spatiotemporal resolutions by combining successive single-turn acquisitions. And third, because most current MRI systems do not yet have sufficient computing power for iterative real-time reconstructions, multi-turn data sets may also be used for online sliding-window reconstructions based on gridding. In fact, while nonlinear inverse reconstructions were obtained from each single turn (see below), online control of real-time acquisitions was accomplished with the use of less undersampled datasets (S. Zhang et al., 2010) by combining data from 5 consecutive turns and reconstructing respective images by gridding (see J. D. O'Sullivan et al. in "IEEE Trans. Med. Imag." vol. 4, 1985, p. 200-207, J. F. Kaiser in "Proc. IEEE Int. Symp. Circuits Syst." 1974, p. 20-23, and J. I. Jackson et al. in "IEEE Trans. Med. Imag." vol. 10, 1991, p. 473-478) with sliding window (S. J. Riederer et al. in "Magn. Reson. Med." vol. 8, 1988, p. 1-15).

2.2 Real-Time Reconstruction

Reconstructions using regularized nonlinear inversion were performed offline for single-turn radial encodings with 9 to 25 spokes. Corresponding movies consisted of successive reconstructions without sliding window. Therefore true frame rates were achieved that correspond to the reciprocal of the actual image acquisition time. All radial spokes were acquired with oversampling by a factor of 2, so that a base resolution of 128 data samples per spoke resulted in 256 complex samples for image reconstruction. The procedure ensures the absence of image aliasing for field-of-views smaller than the actual object.

In the present example, 4 Tesla C1060 GPUs (Nvidia, Calif., USA) were used, each providing 240 processing cores. Apart from the CPU-based preprocessing and initialization steps, the GPU-based iterative reconstruction was simplified to point-wise operations, FFT applications, and calculations of scalar products. Each of these operations is either easy to implement or readily available through the programming library of the GPU vendor. Typically, the iterative reconstruction of a single frame at 128 matrix resolution took about 4 s per GPU, although further acceleration is possible.

|  | Flow (FIG. 5) | Speech (FIG. 6) | Heart (FIG. 7) |
| --- | --- | --- | --- |
| Imaging time/ms | 20 | 55 | 30 |
| Rate/Frames s$^{-1}$ | 50 | 18 | 33 |
| Resolution/mm$^3$ | 1.5 × 1.5 × 8 | 1.5 × 1.5 × 10 | 2.0 × 2.0 × 8 |
| Field-of-view/mm$^2$ | 256 × 256 | 192 × 192 | 256 × 256 |
| Reconstruction matrix | 176 × 176 | 128 × 128 | 128 × 128 |
| Acquired spokes | 9 | 25 | 15 |
| Repetition time/ms | 2.2 | 2.2 | 2.0 |
| Echo time/ms | 1.4 | 1.4 | 1.3 |
| Flip angle/Degree | 8 | 5 | 8 |
| Bandwidth/Hz Pixel$^{-1}$ | 1580 | 1630 | 1955 |
| Processing matrix* | 352 × 352 | 384 × 384 | 384 × 384 |
| Newton steps* | 7 | 9 | 7 |
| Regularization* (n-th Newton step) | $.5^{n-1}\|x_n - .8x_0\|^2$ | $.5^{n-1}\|x_n - x_0\|^2$ | $.5^{n-1}\|x_n - x_0\|^2$ |
| Fourier weighting of coil sensitivities $-0.5 < k_x, k_y < 0.5$ | $(1 + 225 \|k\|^2)^{16}$ | $(1 + 225 \|k\|^2)^{16}$ | $(1 + 225 \|k\|^2)^{16}$ |

(*see M. Uecker et al., 2008)

For all examples shown here the preprocessing steps (S21, see FIG. 1) were performed. To reduce the computation time, the raw data from all (up to 32) receive channels were reduced to 12 principal components by a channel compression technique. The reduced data were then interpolated to the processing grid and normalized such that the L2-norm after interpolation to the processing matrix was 100. Finally, the data were transferred to the GPU for reconstruction. For further details about specific reconstruction parameters see the above table.

Moreover, after reconstruction consecutive frames of a movie were temporally filtered using the median filter (see 1.4) extending over 5 images, which is in correspondence to the interleaved spoke arrangement. Finally, the images were subject to spatial filtering, which involves a medium edge enhancement and adaptive smoothing taking into account the continuation of local tissue structures (preferably using commercially available software). The achieved reconstruction quality as a function of temporal resolution or degree of undersampling is shown for diastolic (FIG. 4C) and systolic short-axis views of the human heart (FIG. 4D) selected from respective real-time MRI movies. The images were obtained from only 25, 15, and 9 spokes (128 matrix resolution) with acquisition times of 50, 30, and 18 ms, respectively.

2.3 Real-Time MRI Studies

Figure 5:
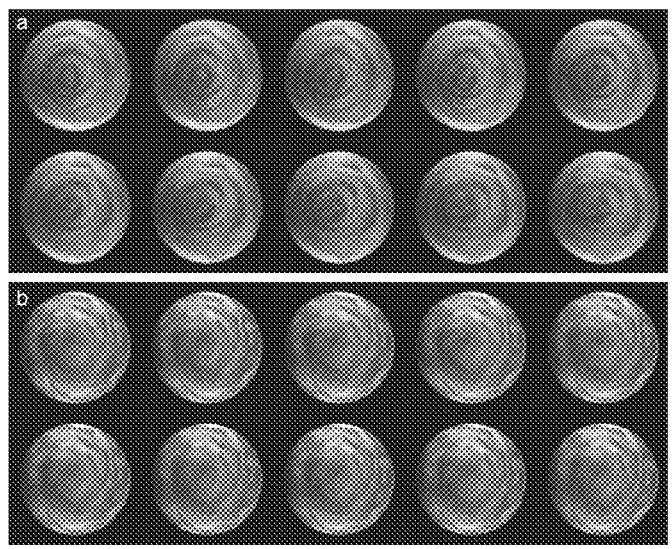
FIG. 5: examples of MR images of a turbulent flow.

FIG. 5 illustrates real-time MRI of turbulent flow at 20 ms resolution. The development of turbulent flow patterns in a cylindrical beaker (144 mm inner diameter) filled with tap water (height about 30 mm) was observed for 60 s after manual stirring for about 5 s. The beaker was positioned within a standard 32-channel head coil. The horizontal images at medium height covered a 256·256 mm$^2$ FOV with a base resolution of 176 data samples (1.5·1.5 mm2, 8 mm section thickness). RF-spoiled FLASH MRI acquisitions employed a repetition time of TR=2.2 ms, a gradient-echo time of TE=1.4 ms, and a flip angle of 8° yielding T1 contrast (further details, see table).

The two sets of T1-weighted images (10 successive frames=200 ms, top left to bottom right) refer to a horizontal section through a circular beaker filled with tap water. They were selected from the same movie at about (a) 10 s and (b) 30 s after the end of manual stirring and reflect flow patterns with different velocities. Individual images (1.5 mm in-plane resolution, 8 mm section thickness) were acquired within 20 ms (9 spokes, TR=2.2 ms) corresponding to a rate of 50 frames per second.

Figure 6:
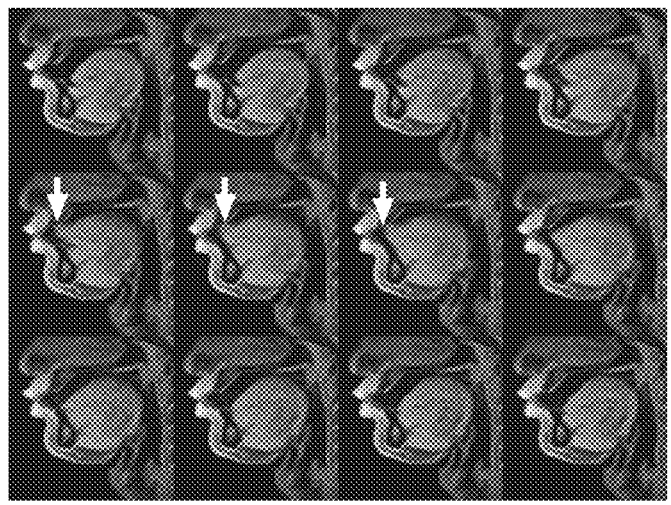
FIG. 6: examples of MR images illustrating speech production of a human subject.

FIG. 6 illustrates real-time MRI of speech production at 55 ms resolution. Studies of human speech production were performed in a mid-sagittal orientation covering the lips, tongue, soft palate, pharyngeal area, and vocal fold. The acquisitions combined the posterior 16-coil array of the 32-channel head coil with a surface coil (70 mm diameter) next to the larynx and a flexible 4-array coil positioned in a circular shape over the lower face at a distance of about 20 mm. Preliminary applications focused on the co-articulation of vowels (e.g., [a], [u], [i]) and plosives (e.g., [t], [d]) in simple German logatoms such as [butu] or [bidi]. RF spoiled FLASH MRI acquisitions (1.5·1.5 mm$^2$, 10 mm section thickness) employed a repetition time of TR=2.2 ms, a gradient-echo time of TE=1.4 ms (opposed-phase condition for overlapping proton signals from water and fat at 3 T), and a flip angle of 5°. The images covered a 192·192 mm$^2$ FOV with a matrix resolution of 128 data samples. Real-time movies were obtained at 18 to 30 frames per second corresponding to image acquisition times of 33 to 55 ms (15 to 25 spokes). For the present examples of speech production at moderate speed best results were achieved for 25 spokes at 18 frames per second (further details, see table).

The images (12 successive frames=660 ms, top left to lower right) were obtained from a healthy subject during speaking of the German logatom [butu]. The selected period centers on the articulation of the plosive [t] (arrows) with the tongue touching the upper alveolar ridge for about 150 ms. Individual images (midsagittal orientation, 1.5 mm in-plane resolution, 10 mm section thickness) were acquired within 55 ms (25 spokes, TR=2.2 ms) corresponding to a rate of 18 frames per second.

Figure 7:
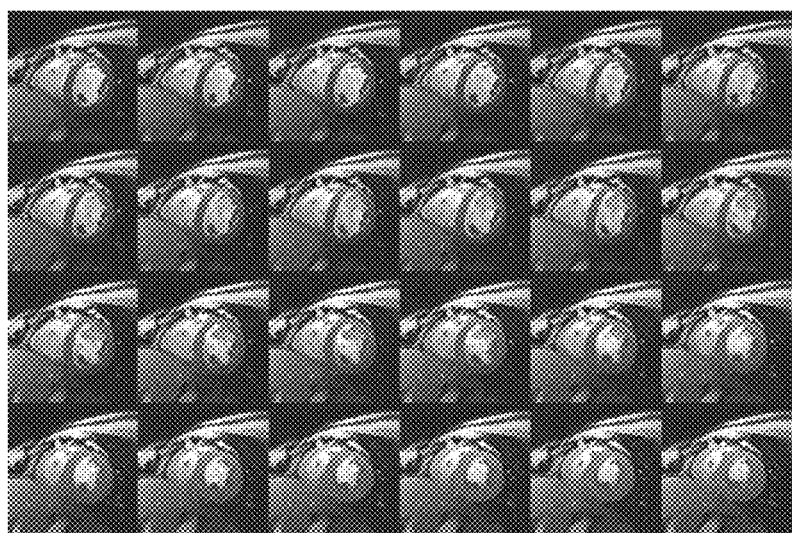
FIG. 7: examples of MR images of the human heart.

FIG. 7 illustrates real-time MRI of the human heart at 30 ms resolution. Real-time MRI of the human heart without synchronization to the electrocardiogram and during free breathing was performed with a 32-channel cardiac coil consisting of an anterior and posterior 16-coil array. T1-weighted Rf-spoiled FLASH MRI acquisitions (2.0·2.0 mm$^2$, 8 mm section thickness) employed a repetition time of TR=2.0 ms, a gradient-echo time TE=1.3 ms (opposed-phase condition), and a flip angle of 8°. The images covered a 256·256 mm$^2$ FOV with a base resolution of 128 data samples. As in the aforementioned applications, movies were obtained for a wide range of rates from 20 to 55 frames per second with corresponding imaging times of 50 to 18 ms (25 to 9 spokes). Recordings in different anatomically defined orientations included short-axis views, 2-chamber views, and 4-chamber views covering the entire heart in sequential scans (further details, see table).

The short-axis views (24 successive frames=720 ms) were obtained from a healthy subject during free breathing and extend over about ¾ of a cardiac cycle from diastole (top left) to systole (lower right). Individual images (2.0 mm in-plane resolution, 8 mm section thickness) were acquired within 30 ms (15 spokes, TR=2.0 ms) corresponding to a rate of 33 frames per second.

The features of the invention disclosed in the above description, the figures and the claims can be equally significant for realizing the invention in its different embodiments, either individually or in combination.

The invention claimed is:

1. A method for reconstructing a sequence of magnetic resonance (MR) images of an object under investigation, comprising the steps of:
   (a) providing a series of sets of image raw data including an image content of the MR images to be reconstructed, said series of sets of image raw data being collected with the use of at least one radiofrequency receiver coil of a magnetic resonance imaging (MRI) device, wherein:

each set of image raw data includes a plurality of data samples being generated with a gradient-echo sequence that spatially encodes an MRI signal received with the at least one radiofrequency receiver coil using a non-Cartesian k-space trajectory, each set of image raw data comprises a set of homogeneously distributed lines in k-space with equivalent spatial frequency content, the lines of each set of image raw data cross a center of k-space and cover a continuous range of spatial frequencies, and positions of the lines of each set of image raw data differ in successive sets of image raw data, and (b) subjecting the series of sets of image raw data to a regularized nonlinear inverse reconstruction process to provide the sequence of MR images, wherein each of the MR images is created by the regularized nonlinear inverse reconstruction process including simultaneous estimation of a sensitivity of the at least one receiver coil and the image content, and a regularization using a preceding non-zero reference estimation of the sensitivity of the at least one receiver coil and the image content reconstructed from said series of sets of image raw data.

2. The method according to claim 1, wherein the reconstruction process includes a filtering process suppressing image artifacts.

3. The method according to claim 2, wherein the filtering process includes a temporal median filter.

4. The method according to claim 1, wherein the lines of each set of image raw data correspond to rotated straight lines.

5. The method according to claim 1, wherein:

the sequence of MR images is a time series of one single cross-sectional slice of the object, or the sequence of MR images represents a series of multiple cross-sectional slices of the object, or the sequence of MR images represents a time series of multiple cross-sectional slices of the object, wherein the image raw data are collected in such a way that successive lines in k-space are from different slices (interleaved multislice data sets), or such that successive series of sets of image raw data are from different slices (sequential multislice data sets).

6. The method according to claim 1, wherein the gradient-echo sequence comprises:

a single-echo FLASH sequence,
a multi-echo FLASH sequence,
a FLASH sequence with refocusing gradients,
a FLASH sequence with fully balanced gradients, or
a true-FISP sequence.

7. The method according to claim 1, wherein each set of image raw data comprises an uneven number of lines with an equal axial distribution.

8. The method according to claim 1, wherein a number of lines of each set of image raw data is selected such that a resulting degree of undersampling is at least a factor of 5.

9. The method according to claim 8, wherein the number of lines of each set of image raw data is selected such that a resulting degree of undersampling is at least a factor of 10.

10. The method according to claim 1, wherein a number of lines of each set of image raw data is at most 30.

11. The method according to claim 10, wherein the number of lines of each set of image raw data is at most 20.

12. The method according to claim 1, wherein a duration of collecting each set of image raw data is at most 100 ms.

13. The method according to claim 12, wherein a duration of collecting each set of image raw data is at most 50 ms.

14. The method according to claim 1, wherein the lines of each set of image raw data are selected such that the lines of successive series of sets of image raw data are rotated relative to each other by a predetermined angular displacement.

15. The method according to claim 14, wherein a number of successive series of sets of image raw data with different positions of lines is selected in the range of 2 to 15.

16. The method according to claim 14, wherein a number of successive series of sets of image raw data with different positions of lines is selected in the range of 3 to 7.

17. The method according to claim 1, wherein the series of sets of image raw data are provided by arranging the object in the MRI device including the at least one receiver coil, subjecting the object to the gradient-echo sequence, and collecting the series of sets of image raw data using the at least one receiver coil.

18. The method according to claim 1, wherein the series of sets of image raw data are provided by receiving the series of sets of image raw data by a data transmission collected from a distant MRI device.

19. An MRI device being configured for creating a sequence of MR images of an object under investigation, comprising:

an MRI scanner including a main magnetic field device, at least one radiofrequency excitation coil, at least two magnetic field gradient coils and at least one radiofrequency receiver coil, and a control device being adapted for controlling the MRI scanner for collecting the series of sets of image raw data and reconstructing the sequence of MR images in accordance with the method of claim 1.

* * * * *

UNITED STATES PATENT AND TRADEMARK OFFICE
CERTIFICATE OF CORRECTION

PATENT NO. : 8,384,383 B2  
APPLICATION NO. : 12/730178  
DATED : February 26, 2013  
INVENTOR(S) : Frahm et al.

Page 1 of 1

It is certified that error appears in the above-identified patent and that said Letters Patent is hereby corrected as shown below:

Title Page Item (73) "Assignee", the Assignee's name reading "Max-Planck-Gesellschaft zur Foerferung der Wissenschaften E.V." should read ---Max-Planck-Gesellschaft zur Foerderung der Wissenschaften e.V.--.

Signed and Sealed this  
Ninth Day of July, 2013

Teresa Stanek Rea  
*Acting Director of the United States Patent and Trademark Office*